(12) United States Patent
Jeng (10) Patent No.: US 7,375,394 B2
(45) Date of Patent: May 20, 2008

(54) FRINGING FIELD INDUCED LOCALIZED CHARGE TRAPPING MEMORY

(75) Inventor: Erik S. Jeng, Taipei (TW)

(73) Assignee: Applied Intellectual Properties Co., Ltd., Taipei (TW)

( * ) Notice: Subject to any disclaimer, the term of this patent is extended or adjusted under 35 U.S.C. 154(b) by 33 days.

(21) Appl. No.: 11/175,417

(22) Filed: Jul. 6, 2005

(65) Prior Publication Data

US 2007/0018245 A1    Jan. 25, 2007

(51) Int. Cl.
*H01L 29/792*  (2006.01)

(52) U.S. Cl. .......................... 257/324; 257/326; 257/900

(58) Field of Classification Search ................ 257/324, 257/326, 321, 900, 408, 413
See application file for complete search history.

(56) References Cited

U.S. PATENT DOCUMENTS

| | | | |
|---|---|---|---|
| 4,881,108 A | 11/1989 | Yoshikawa | 357/23.5 |
| 5,768,192 A | 6/1998 | Eitan | 365/185.24 |
| 6,335,554 B1 | 1/2002 | Yoshikawa | 257/316 |
| 6,342,410 B1 * | 1/2002 | Yu | 438/164 |
| 6,770,516 B2 | 8/2004 | Wu et al. | 438/154 |
| 6,800,910 B2 | 10/2004 | Lin et al. | 257/410 |
| 7,045,414 B2 * | 5/2006 | Chen et al. | 438/231 |
| 7,078,342 B1 * | 7/2006 | Pan et al. | 438/683 |
| 7,095,077 B2 * | 8/2006 | Kataoka et al. | 257/324 |
| 2006/0208312 A1 * | 9/2006 | Iwata et al. | 257/324 |

OTHER PUBLICATIONS

Hsieh et al., "NVM Characteristics of Single-MOSFET Cells using Nitride Spacers with Gate-to-Drain NOI," IEEE Transactions on Electron Devices, vol. 51, No. 11, Nov. 2004.
Jeng et al., "Investigation of Programming Charge Distribution in Nonoverlapped Implantation nMOSFET," IEEE Transactions on Electron Devices, vol. 53, No. 10, Oct. 2006.
Padilla et al., "Dual-bit SONOS FinFET Non-Volatile Memory Cell and New Method of Charge Detection," Department of Electrical Engineering and Computer Sciences, University of California at Berkeley, Berkeley, California, 2007.

* cited by examiner

*Primary Examiner*—Mark V. Prenty
(74) *Attorney, Agent, or Firm*—Kusner & Jaffe (57) ABSTRACT

The present invention includes a semiconductor layer formed over an insulation layer and a substrate. Doped regions are formed in a portion of the semiconductor layer. A gate dielectric and a gate are respectively formed over the semiconductor layer. The arrangement of the gate sidewall and semiconductor layer surface is substantially orthogonal, multi-portion dielectric layer is formed on the gate and a portion of the silicon layer. Charge trapping dielectrics are attached on the multi-portion dielectric layer acting as carrier trapping structure. The gate-to-source/drain non-overlapped implantation is capable of storing multi-bits per transistor.

19 Claims, 8 Drawing Sheets

FIG. 3 X-Z & X-Y cross-section

FIG. 4: X-Y cross-section　　　　　　　　X-Z cross-section

FIG. 5: X-Y cross-section　　　　　　　　X-Z cross-section

FIG. 6: X-Y cross-section     X-Z cross-section

FIG. 7: X-Y cross-section     X-Z cross-section

FIG. 8: X-Y cross-section     X-Z cross-section

FIG. 9: X-Y cross-section     X-Z cross-section

FIG. 10: X-Y cross-section

X-Z cross-section

FIG. 11: X-Y cross-section

X-Z cross-section

FIG. 12: X-Y cross-section

X-Z cross-section

FIG. 13: X-Y cross-section

X-Z cross-section

FIG. 14: X-Y cross-section　　　　　　X-Z cross-section

FIG. 15: X-Y cross-section　　　　　　X-Z cross-section

FIG. 16: X-Y cross-section　　　　　　X-Z cross-section

FIG. 17: X-Y cross-section　　　　　　X-Z cross-section

FIG. 18: X-Y cross-section    X-Z cross-section

FIG. 19: X-Y cross-section    X-Z cross-section

FIG. 20: X-Y cross-section    X-Z cross-section

FIG. 21: X-Y cross-section    X-Z cross-section

FIG. 22: X-Y cross-section     X-Z cross-section

FIG. 23: X-Y cross-section     X-Z cross-section

FIG. 24: X-Y cross-section     X-Z cross-section

FIG. 25: X-Y cross-section     X-Z cross-section

FIG. 26: X-Y cross-section    X-Z cross-section

FIG. 27: X-Y cross-section    X-Z cross-section

FRINGING FIELD INDUCED LOCALIZED CHARGE TRAPPING MEMORY

FIELD OF THE INVENTION

The present invention relates to a semiconductor device, and more specifically, to a nonvolatile memory with FinFET structure capable of trapping carriers.

BACKGROUND OF THE INVENTION

The semiconductor industry has been advanced to the field of Nanometer Scale technologies. The fabrication of the nonvolatile memories also follows the trend of the size reduction. The nonvolatile memory includes various types of devices which have been developed for specific applications. One of the applications of flash memory is BIOS for computers. The high-density nonvolatile memories can be applied as the mass storage of portable handy terminals, solid-state camera and PC cards. It is because that the nonvolatile memories exhibit many advantages, such as memory retention without power, fast access time, low power dissipation in operation, and robustness.

The formation of nonvolatile memories toward the trends of low supply power and fast access, because these requirements are necessary for the application of the mobile computing system. Nonvolatile memory devices include a floating gate to store charges and an element for electrically placing charge in and removing the charges from the floating gate. At present, the low voltage nonvolatile memory is applied with a voltage of about 3V to 5V during charging or discharging the floating gate. In order to attain high tunneling efficiency, the thickness of the dielectric between the floating gate and substrate has to be scaled down due to the supply voltage is reduced. The data program method of a non-volatile memory device includes a method using Fowler-Nordheim (FN) tunneling. In FN tunneling, a high voltage is applied to a control gate to induce a high electric field in a tunnel oxide layer, and electrons of a semiconductor substrate pass the tunnel oxide layer and are injected into a floating gate. During the mode of erasing, the bias may apply on the source to discharge the electron from the floating gate to the source of a memory device.

Currently, the SOC (system on chip) desires memory with high operation speed and integrated in one single chip. For example, the single polysilicon processing may integrate with other devices such as transistors. The typical non-volatile memory employs stack gate memories by double polysilicon processing. One type of the memories uses trapping layer instead of floating gate (FG) to hold the carrier. The memory cells are constructed with a trapping ONO or ON layer. The memory cell generally includes a P-type silicon substrate and two PN junctions between N+ source (or drain regions) and P type substrate, a nitride layer sandwiched between two oxide layers and a polycrystalline layer. To program or write the cell, voltages are applied to the drain and the gate and the source is grounded. These voltages generate an electric field along the length of the channel from the source to the drain. This electric field causes electrons to be drawn off the source and begin accelerating towards the drain. The hot electrons are generated at the boundary between drain and channel during the acceleration.

In the prior art, please refer to U.S. Pat. Nos. 4,881,108; 5,768,192 to Eitan B. entitled "Non-volatile semiconductor memory cell utilizing asymmetrical charge trapping", filed on 16 Jun. 1998. The charge trapping memory may also be referred to U.S. Pat. No. 6,335,554 to Yoshikawau and Kuniyoshi, entitled "Semiconductor Memory". The patent disclosed a memory with ONO structure. Further article teaches the memory with ONO stacked layer could also be found. Please refer to the article, Chan, T. Y. et al, "A True Single-Transistor Oxide-Nitride-Oxide EEPROM Device," IEEE Electron Device Letters, vol. EDL-8. No. 3, March 1987.

Furthermore, another type structure called FinFET is developed recently. The channel region of the device is similar to a Fin structure that is why it was named as FinFET device. The source/drain and the channel are formed in a single crystallographic orientation silicon layer. Gate oxide is subsequently formed over the silicon layer, followed by forming a gate wrapping the channel region, thereby creating the creating the dual gate structure. Thus, the channel width of the FinFET device is wider than the prior structure. It allows generating higher driving current than that of the conventional FET device. In the prior art, please refer to U.S. Pat. Nos. 4,881,108; 6,800,910 to Lin; Ming-Ren, and assigned to Advanced Micro Devices, Inc., entitled "FinFET device incorporating strained silicon in the channel region". The filing date is Dec. 31, 2002. Other reference could refer to U.S. Pat. No. 6,770,516, assigned to Taiwan Semiconductor Manufacturing Company, entitled "Method of forming an N channel and P channel FINFET device on the same semiconductor substrate". The filing date is Sep. 5, 2002.

SUMMARY OF THE INVENTION

The object of the present invention is to disclose a Fringing Field Induced Localized Charge Trapping Memory.

The present invention discloses n-MOSFET with gate-to-drain non-overlapped implantation (NOI) as a non-volatile memory device capable of storing multi-bits per cell.

The present invention discloses a fringing field induced charge trapping memory comprising: an isolation or semiconductor substrate having a semiconductor layer formed thereon. The semiconductor layer includes a planar or non-planar channel. Source and drain regions are formed in a portion of the semiconductor layer, wherein a pocket ion implantation region is optionally formed adjacent to the source and drain regions, the conductive type of the pocket ion implantation region is opposite to the one of the doped region. A gate dielectric layer is formed on the semiconductor layer and a gate structure is next formed on the gate dielectric layer. The gate structure of includes dual gate, triple gate or FinFET structure. A normal field induced channel is formed in the semiconductor layer and under the gate structure. A multi-portion structure consisting of a perpendicular portion and a parallel portion is formed on the sidewall of the gate structure and on the semiconductor layer, wherein the parallel portion acts as tunneling part and the perpendicular portion acts as a charge barrier. The perpendicular portion and the parallel portion are formed simultaneously or respectively.

A fringing field induced channel is formed in the semiconductor layer and under the parallel portion of the multi-portion structure. A charging (or spacer) for charge trapping is formed on the multi-portion structure for storing carriers. Metal-semiconductor compound or silicide is optionally formed on the gate structure and the source and drain regions. One aspect of the present invention is that a Non-Overlapped Implantation structure is formed by the gate structure and the source and drain regions. The configuration of the gate structure and the source, drain regions is substantially orthogonal.

The fringing field induced channel is formed between the normal field induced channel and the drain region. The carrier flows from the normal field induced channel to the drain region through the fringing field induced channel during a programming mode. The hot carriers are injected from the fringing field induced channel and stored in the charging layer through the multi-portion structure. In a read mode, carrier flows from the drain region to the normal field induced channel through the fringing field induced channel.

In one embodiment, the memory further comprises lightly doped drain region formed adjacent to the source and drain regions, wherein the junction of the lightly doped drain region being shallower than the one of the source and drain regions and under the gate structure. A double doped drain region could also be formed adjacent to the source and drain regions, wherein the junction of the double doped drain region being deeper than the one of the source and drain regions and under the gate structure.

The charging layer (or spacer) is formed of nano-scale particles or nitride or the material having energy gap lower than 6 eV The memory further comprises a first dielectric layer (or spacer) formed on the charging layer (or spacer) wherein the first dielectric layer (or spacer) includes oxide or the material having energy gap greater than 7 eV. Similarly, the memory could also comprises a second dielectric layer (or spacer) formed on the first dielectric layer (or spacer) wherein the second dielectric layer (or spacer) includes oxide or nitride.

The material of the gate dielectric layer includes silicon oxide ($SiO_2$), zirconium oxide ($ZrO_2$) or hafnium oxide ($HfO_2$). The silicide includes $TiSi_2$, $CoSi_2$ or NiSi.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention proposes a novel structure of a nonvolatile memory for charge trapping. In the structure, the cell capacity for storing data can be increased by the cell structure. One aspect of the present invention is the gate-to-source/drain non-overlapped implantation (NOI). The FinFET device according to the invention allows storing single or multiple bits in a cell.

Figure 1:
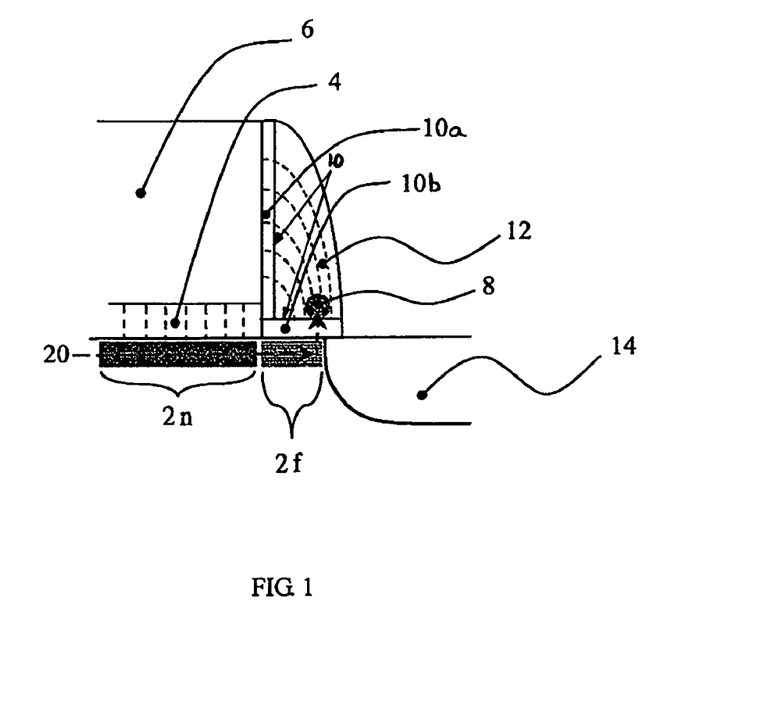
FIG. 1 is a cross sectional view according to the present invention.
Figure 2:
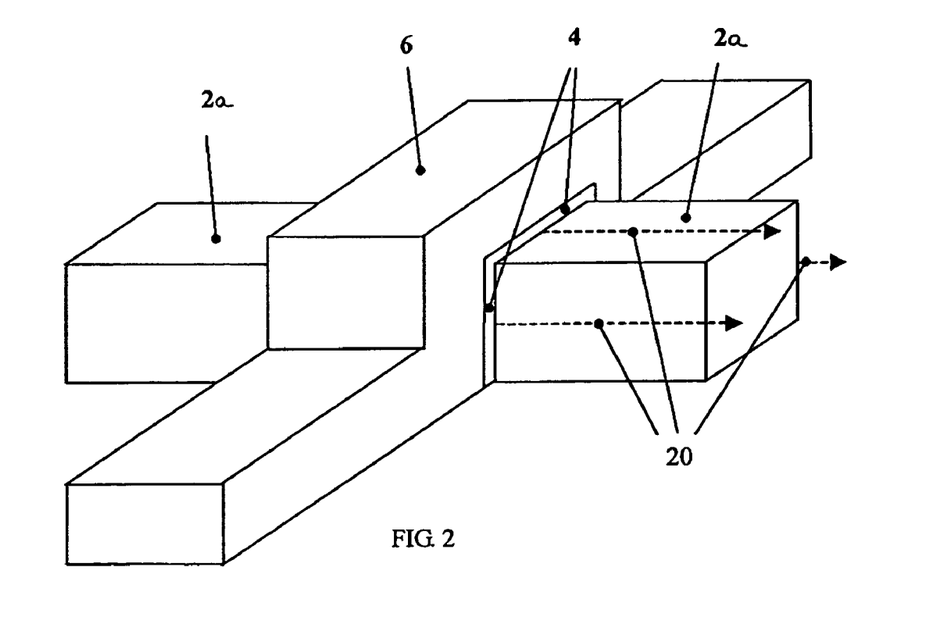
FIG. 2 is a cross sectional view illustrating the three-dimension structure according to the present invention.
Figure 3:
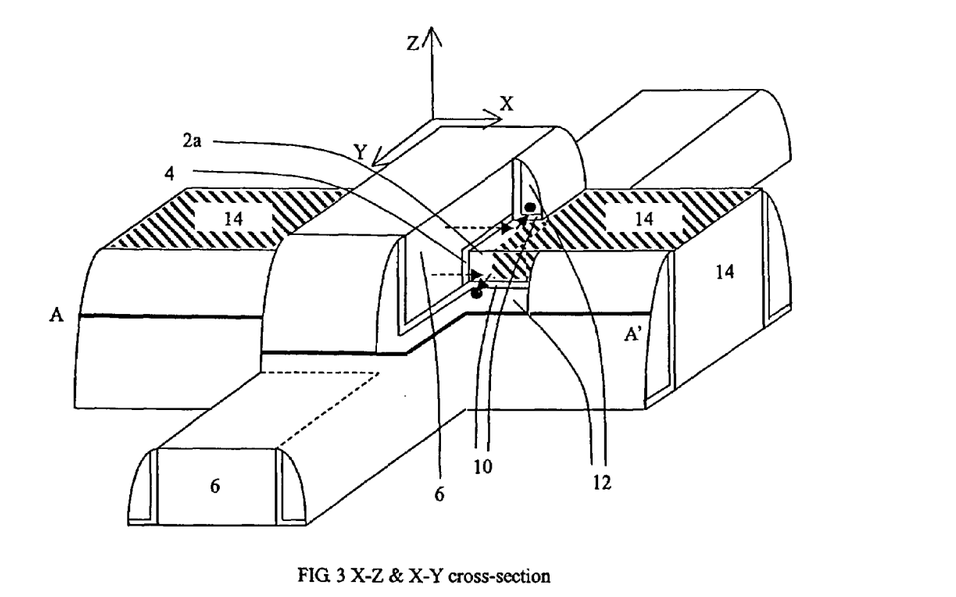
FIG. 3 is a cross sectional view illustrating the three-dimension structure according to the present invention.
Figure 4:
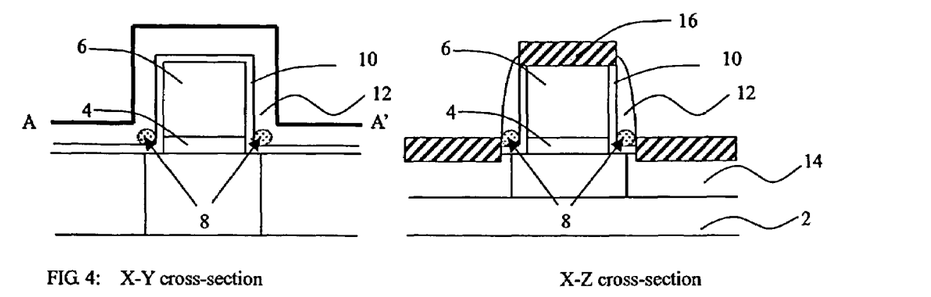
FIG. 4 is a cross sectional view of a semiconductor wafer illustrating the first embodiment according to the present invention.

Please refer to FIG. 1, the Figure shows that the carriers flow toward to the drain. The fringing field induced carriers occur at the region under the multi-portion's parallel portions adjacent to the gate. The region is called the fringing field induced region. The present invention includes planar or non-planar channel (such as Double-gate or Tri-gate or Triple-gate of Fin FET) located on the SOI substrate. The fringing field induced channel $2f$ is generated between the normal channel $2n$ (under the gate 6/gate oxide 4) and the drain 14. The hot carriers are injected into the tunneling oxide 10 and trapped by the carrier trapping dielectric 12 (the spacer for example) under the fringing field. FIG. 2 and FIG. 3 show the three dimensions illustration according to the present invention. The carrier flowing direction and the fringing field induced region are indicated in the drawing. NOI (non-overlapped implantation) structure consisted of the gate structure 6 and the ion doped region 14 could be observed. The configuration of the gate structure (or sidewall spacers) and the semiconductor layer used to form S/D is substantially orthogonal. The Fringing-field-induced channel (FFIC) is formed between the Normal-field-induced channel (NFIC) and the junction edge of the drain. In the programming, the hot carriers are induced by the normal induced channel and flows through the fringing induced channel to the drain. The perpendicular portion 10a of the multi-portion structure 10 is used to act as a charge barrier to prevent the trapped carriers from escaping from the charge-trapping layer. The parallel portion 10b and the perpendicular portion 10a of the multi-portion structure 10 could be formed simultaneously or respectively. In one embodiment, the thickness of the gate dielectric layer is about 7 nm, and the 250 nm N-type poly-gate is used. The sidewall spacer is formed of silicon nitride and the length dimension is about 80 nm. The thickness of the tunneling oxide is about 6 nm. The configuration of the channel and gate is substantially orthogonal and the gate semiconductor layer crosses over the channel silicon layer as shown in FIG 2. In FIG. 3, it shows that a dielectric layer covers the gate's sidewall and semiconductor layer used for channel. The sidewall spacers along line A-A' are attached on the sidewall of the gate and on the dielectric layer.

The detail description will be seen as follows. A substrate 2 is provided for the present invention. In a preferred embodiment, as shown in the FIGS. 4-13, the cross sectional view is taken from X-Y, X-Z plane in FIG. 3, respectively. In X-Y cross-section view, the space 12 and dielectric layer 10 (multi-portion structure) along line A-A' are extending over the gate 6. In one example, a (silicon on insulator) SOI substrate or semiconductor substrate is provided. The substrate 2 having a semiconductor layer 2a formed thereon includes a gate 6/gate dielectric layer 4 on the semiconductor layer used to form the channel and S/D. An ion-doped region (source and drain) 14 is formed in the semiconductor layer 2a and adjacent to the ion doped region (source and drain) 14. The semiconductor layer could be a silicon layer. Normal field channel will be generated under the gate, and a gate-to-drain non-overlapped implantation (NOI) is constructed according to the present invention, the structure allows storing multi-bits information. Referring to FIGS. 1-4, the gate 6, channel region, S/D 14 is formed of silicon layer and deposited by CVD. The thin dielectric layer 4 consisted of silicon dioxide is formed on the semiconductor layer 2a over the substrate 2 to act as gate oxide. Typically, the layer 4 can be grown in oxygen ambient at a temperature of about 700 to 1100 degrees centigrade. Other method, such as chemical vapor deposition, can also form the oxide. In the embodiment, the thickness of the silicon dioxide layer 4 is approximately 15-250 angstroms. Subsequently, a conductive layer 6 is formed on the layer 4. The conductive layer 4 may be formed of doped polysilicon, in-situ doped polysilicon or epitaxy silicon. For an embodiment, the doped polysilicon layer 6 is doped by phosphorus using a $PH_3$ source. A photo-resist defined patterning process is used on the conductive layer 6, thereby forming the gate structure on the layer 2a. A multi-portion structure is attached on the sidewall of the gate. The multi-portion structure 10 is consisted of a perpendicular portion 10a and the parallel portion 10b. The material for forming the multi-portion structure 10 can be oxide ($SiO_2$) or ($HfO_2$) or the material with energy gap higher than 7 eV. One suitable method for the oxide layer 10 includes thermal oxidation or deposition by CVD, for example, Low Pressure Chemical Vapor Deposition (LP-CVD), Plasma Enhance Chemical Vapor Deposition (PE-CVD), High Density Plasma Chemical Vapor Deposition (HDP-CVD). Still referring to FIG. 4-13, an isotropic etching is performed to create sidewall spacers 12 on the sidewall of the multi-portion structure 10. Reactive ion etching (RIE) or plasma etching is the typical way to achieve the purpose. The spacers 12 include the charge-trapping region, thereby forming the ON structure capable of trapping carriers to define the digital states. The parallel portion 10b of the multi-portion structure 10 acts as the tunneling dielectric for charge trapping. The material for the spacer could be nitride or the material with energy gap smaller than 6 eV. In the preferred embodiment, the reaction gases of the step to form silicon nitride layer include, for example, $SiH_4$, $NH_3$, $N_2$ or $SiH_2Cl_2$, $NH_3$, $N_2$.

The source and drain region 14 is formed by performing an ion implantation to dope ions into the layer 2a using the gate structure 6 and sidewall spacers 12 as a implanting mask. Suicide 16 is introduced on the exposed surface of the top portion of gate and the semiconductor layer 2a on the source and drain regions 14 to reduce their resistance. Preferably, the suicide 16 can be $TiSi_2$, $WSi_2$, $CoSi_2$ or NiSi. The gate structure 6 acts as the control gate, and the nitride spacers are used to trap carriers. The number 8 in the figure indicates the charge that is trapped. The spacers 12 are used to store charges, thereby defining the digital states including (0, 0), (0, 1), (1, 0), (1, 1). A sectional view of a multi-bit nonvolatile memory cell in accordance with the present invention is shown in drawings. The memory cell includes a semiconductor layer 2a having at least two junctions, one is the left junction and the other is the right junction. Channels are located between the two junctions during operation. Above the normal field channel is an oxide 4, on top of the oxide layer 4 is a control gate 6. Spacer 12 is used for charge trapping and is preferably comprised of silicon nitride. The hot electrons or holes are trapped as they are injected into the Spacer 12. The memory cell is capable of storing two bits of data, a right bit and a left bit. The two-bit memory cell is a symmetrical device. The left junction serves as the source terminal and the right junction serves as the drain terminal for the right bit programming. Similarly, for the left bit programming, the right junction serves as the source terminal and the left junction serves as the drain terminal. When the distinction between left and right bits is not crucial to the particular discussion, the terms source and drain are utilized as conventional manner.

The electric field adjacent to the S/D is significant due to the P-N junctions formed by the NOI structure. The hot carrier induced by the NOI occurs at the region right under the sidewall spacers 12 and the hot carrier will inject into the spacers 12 through the tunneling dielectric under the fringing induced field. On the other hand, while the dosage of the source/drain extension portion or lightly doped drain (LDD) is reduced or omitted, the structure could increase the hot carrier current during the write mode and gains the higher writing speed. In order to adjust the writing speed, the LDD structure could be removed or omitted. Based on the drain junction is generated under the nitride spacers 12, the channel hot carriers are expected to be generated at the edge of the drain junction, thereby injecting the carriers into the nitride spacers 12.

Figure 5:
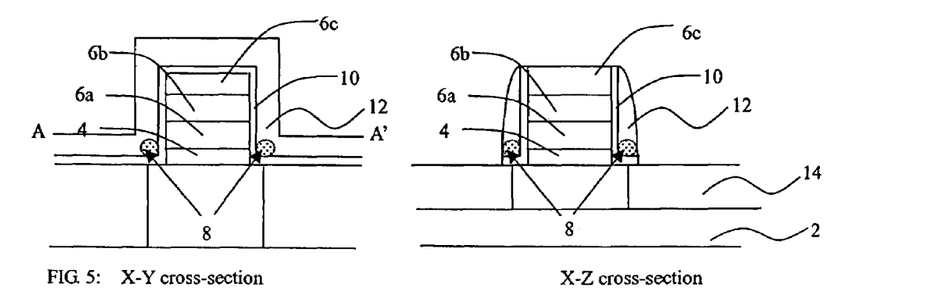
FIG. 5 is a cross sectional view of a semiconductor wafer illustrating the second embodiment according to the present invention.

FIG. 5 illustrates the second embodiment of the present invention. Most of the parts are similar to the first embodiment, the indications are used for the similar portions. The difference between both includes that the silicide 16 at source and drain regions are omits in the second embodiment. The gate is consisted of polysilicon 6a, silicide 6b and dielectric layer 6c. The silicide 6b is preferably formed of $TiSi_2$, $WSi_2$, $CoSi_2$ or NiSi. The dielectric layer 6c is formed of oxide, nitride or the combinations of oxide and nitride layers. The portion 8 of the trapping spacer 12 is used to trapping charge.

Figure 6:
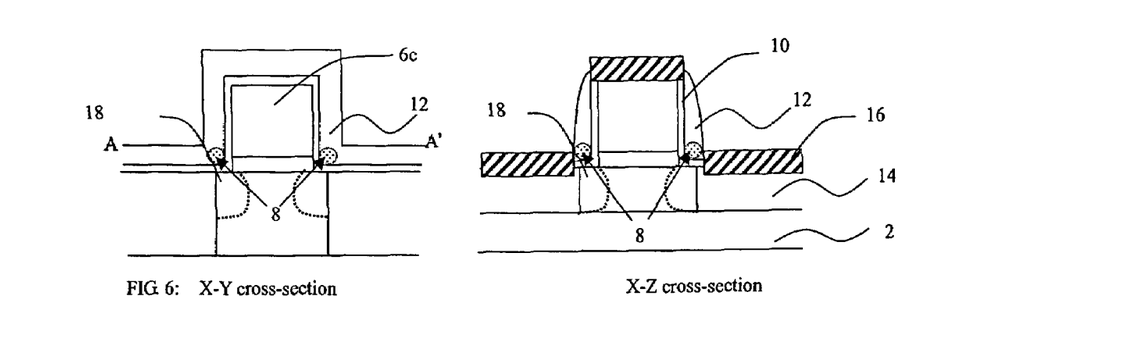
FIG. 6 is a cross sectional view of a semiconductor wafer illustrating the third embodiment according to the present invention.
Figures 7, 8:
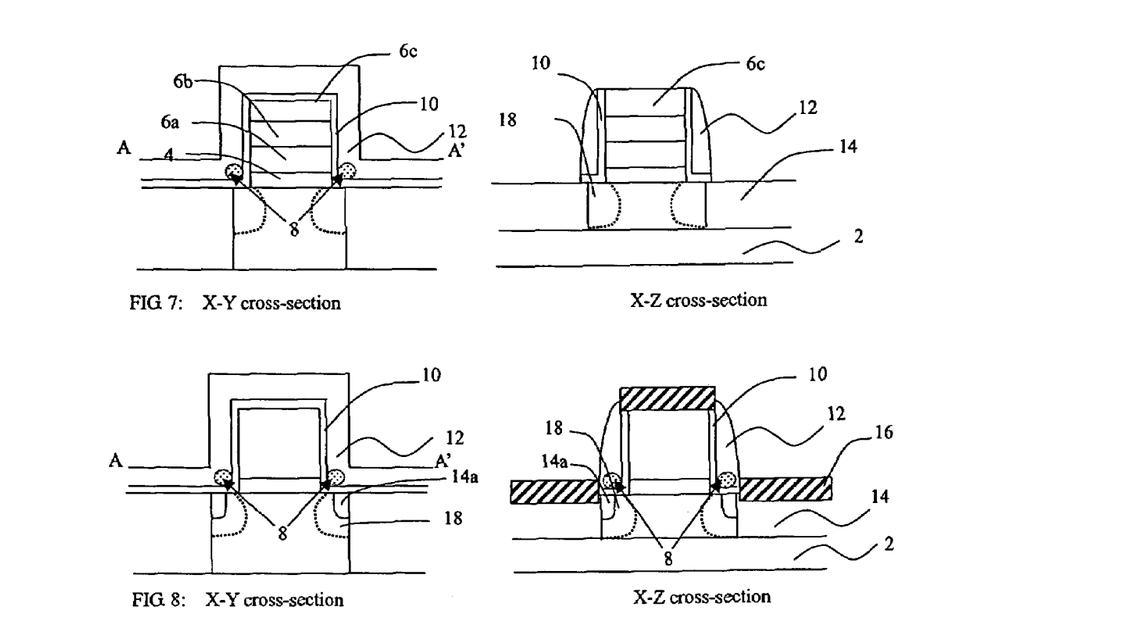
FIG. 7 is a cross sectional view of a semiconductor wafer illustrating the forth embodiment according to the present invention.
FIG. 8 is a cross sectional view of a semiconductor wafer illustrating the fifth embodiment according to the present invention.

Turning to FIG. 6, the embodiment includes pocket ion implantation region 18 adjacent to the source and drain region 14 and under the NOI structure to reduce the punch through effect and increase the efficiency of the hot carrier injection. The conductive type of the pocket implant region 18 is opposite to the one of the source and drain region 14. FIG. 7 shows the alterative example for the present invention. It is similar to the second embodiment. It also includes pocket ion implantation region 18 adjacent to the source and drain region 14.

Figure 9:
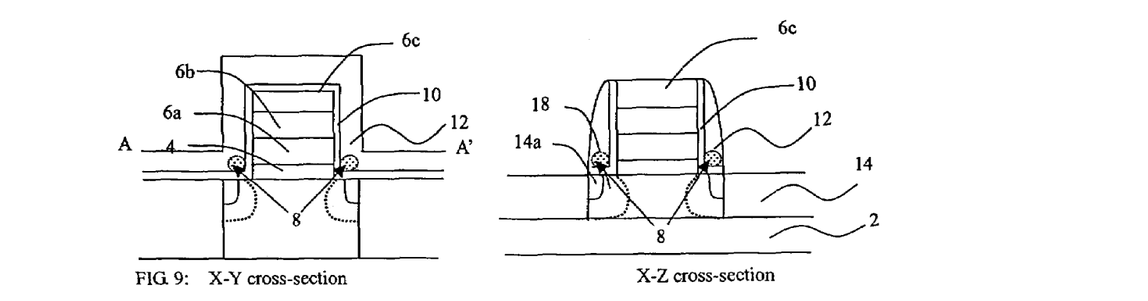
FIG. 9 is a cross sectional view of a semiconductor wafer illustrating the sixth embodiment according to the present invention.

FIGS. 8 and 9 are the alternative approaches with respect to the embodiments shown in FIGS. 6 and 7. The embodiments introduce the lightly doped drain 14a to control the hot carriers and further comprise pocket ion implant region 18 adjacent to the source and drain region 14 and under the portion 8 of the charge trapping spacers 12. The conductive type of the pocket ion implantation region 18 is opposite to the one of the source and drain region 14. The junction of the lightly doped drain 14a is shallower than the one of the source and drain region 14. The lightly doped drain 14a is also closer to the channel under the gate.

Figure 10:
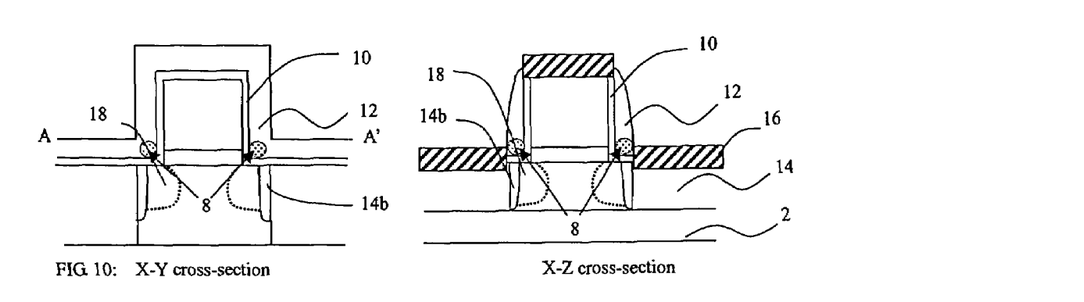
FIG. 10 is a cross sectional view of a semiconductor wafer illustrating the seventh embodiment according to the present invention.
Figure 11:
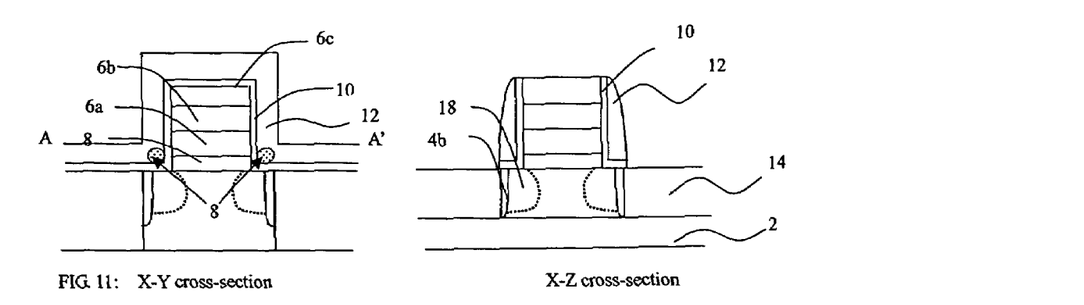
FIG. 11 is a cross sectional view of a semiconductor wafer illustrating the eighth embodiment according to the present invention.

Alternatively, the other embodiments shown in FIGS. 10 and 11 introduce the usage of double diffused drain (DDD) structure 14b to reduce the junction breakdown effect. The conductive ion type of the DDD structure 14b is the same as that of the source and drain region 14. The embodiments further comprise pocket ion implant region adjacent 18 to the double diffused source and drain region.

Figure 12:
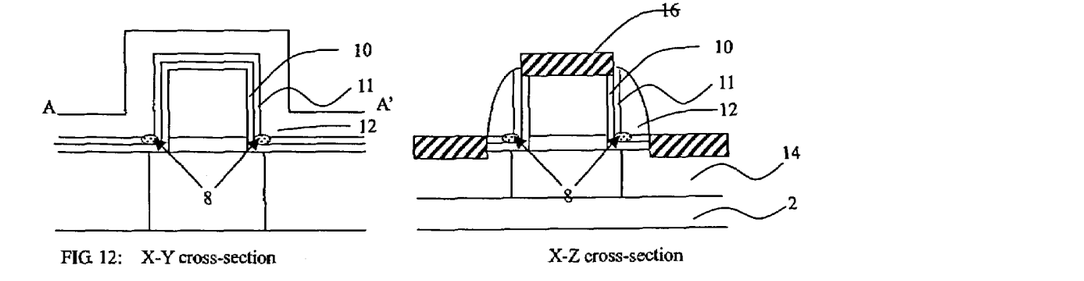
FIG. 12 is a cross sectional view of a semiconductor wafer illustrating the ninth embodiment according to the present invention.
Figure 13:
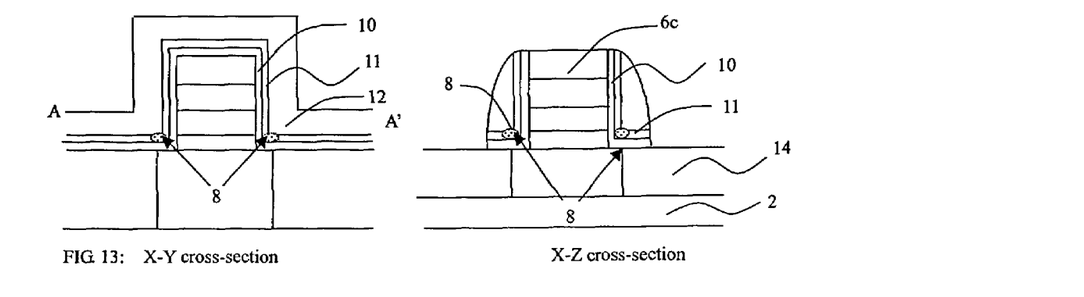
FIG. 13 is a cross sectional view of a semiconductor wafer illustrating the tenth embodiment according to the present invention.
Figure 14:
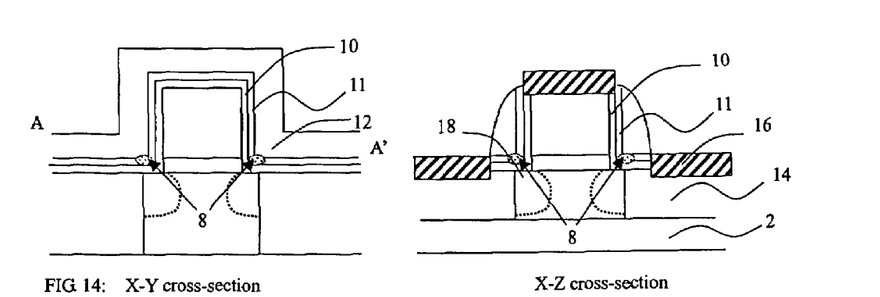
FIG. 14 is a cross sectional view of a semiconductor wafer illustrating the eleventh embodiment according to the present invention.
Figure 15:
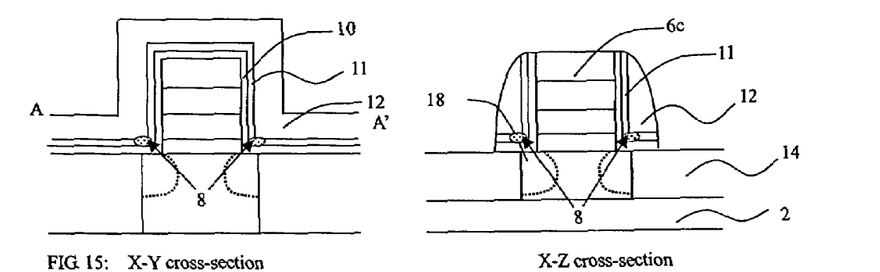
FIG. 15 is a cross sectional view of a semiconductor wafer illustrating the twelfth embodiment according to the present invention.
Figure 16:
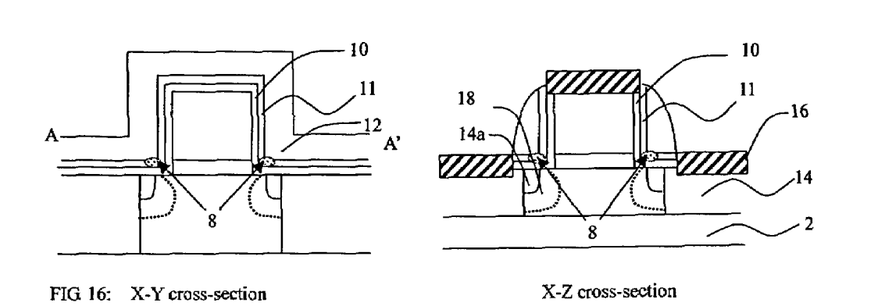
FIG. 16 is a cross sectional view of a semiconductor wafer illustrating the thirteenth embodiment according to the present invention.
Figure 17:
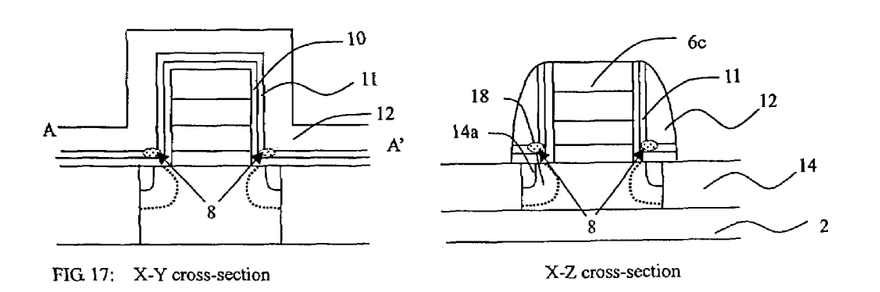
FIG. 17 is a cross sectional view of a semiconductor wafer illustrating the fourteenth embodiment according to the present invention.
Figure 18:
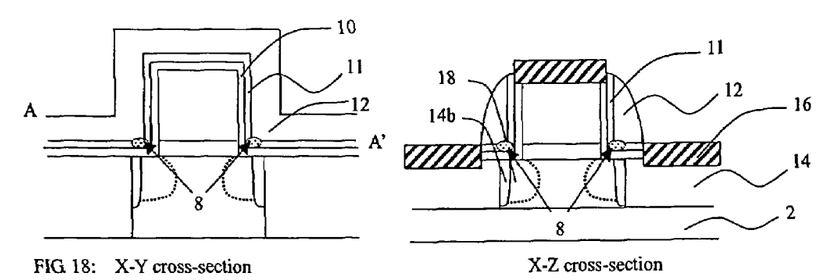
FIG. 18 is a cross sectional view of a semiconductor wafer illustrating the fifteenth embodiment according to the present invention.
Figure 19:
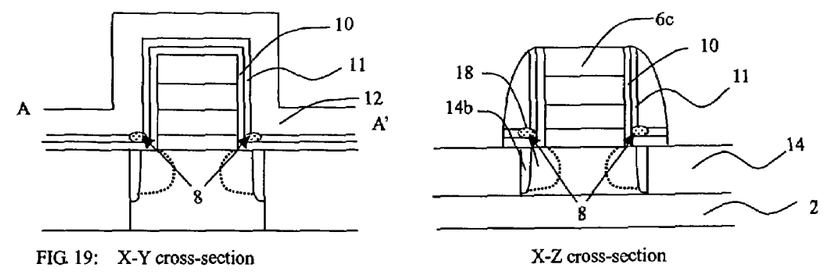
FIG. 19 is a cross sectional view of a semiconductor wafer illustrating the sixteenth embodiment according to the present invention.
Figure 20:
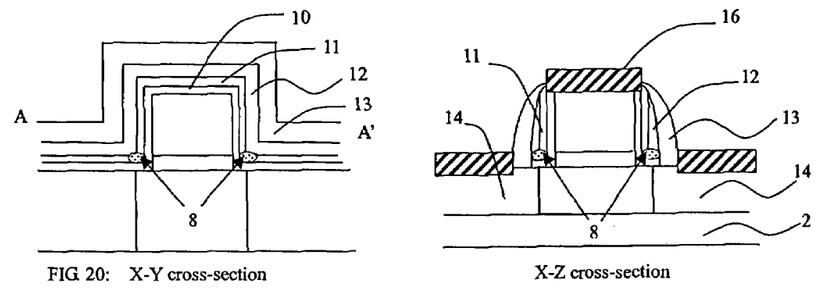
FIG. 20 is a cross sectional view of a semiconductor wafer illustrating the seventeenth embodiment according to the present invention.
Figure 21:
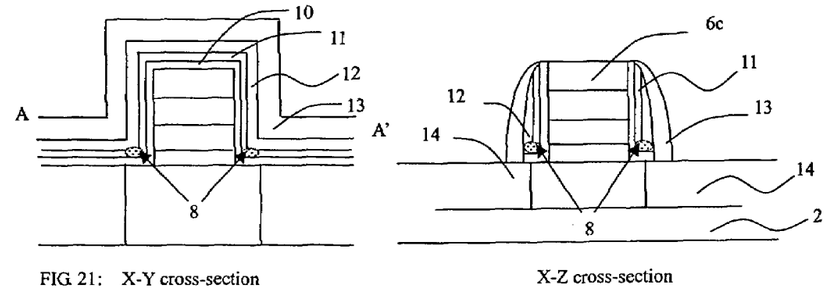
FIG. 21 is a cross sectional view of a semiconductor wafer illustrating the eighteenth embodiment according to the present invention.
Figure 22:
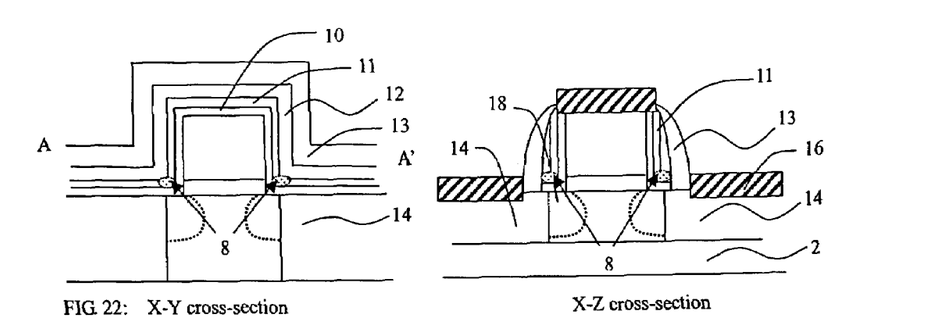
FIG. 22 is a cross sectional view of a semiconductor wafer illustrating the nineteenth embodiment according to the present invention.
Figure 23:
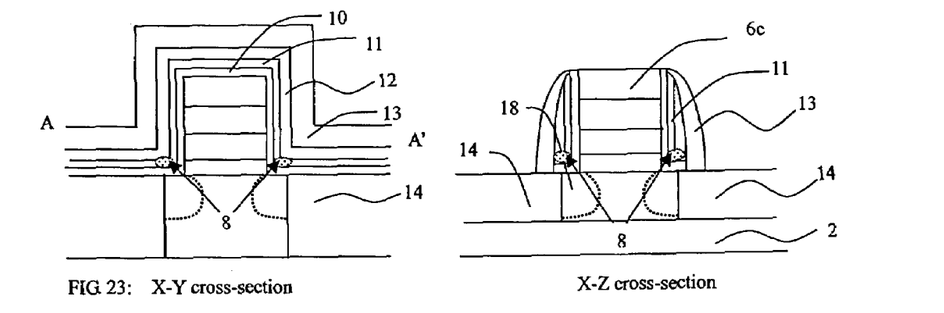
FIG. 23 is a cross sectional view of a semiconductor wafer illustrating the twentieth embodiment according to the present invention.
Figure 24:
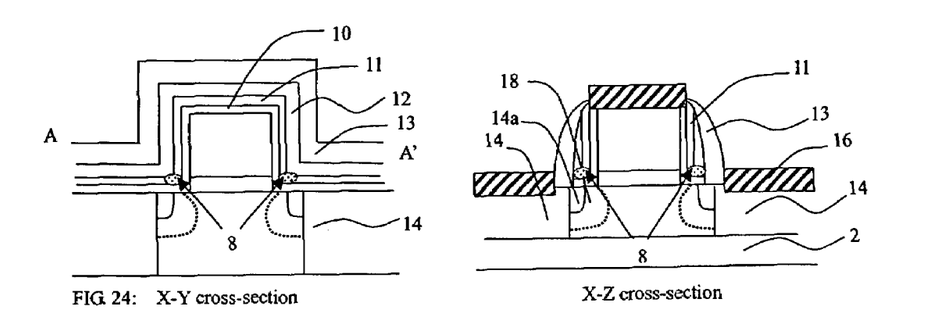
FIG. 24 is a cross sectional view of a semiconductor wafer illustrating the twenty-first embodiment according to the present invention.
Figure 25:
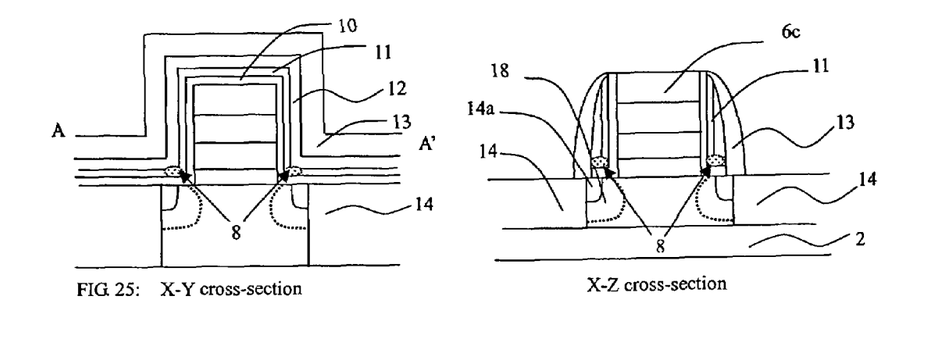
FIG. 25 is a cross sectional view of a semiconductor wafer illustrating the twenty-second embodiment according to the present invention.
Figure 26:
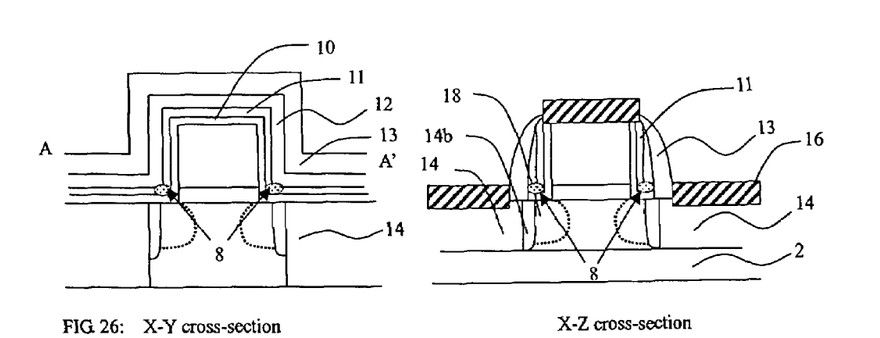
FIG. 26 is a cross sectional view of a semiconductor wafer illustrating the twenty-third embodiment according to the present invention.
Figure 27:
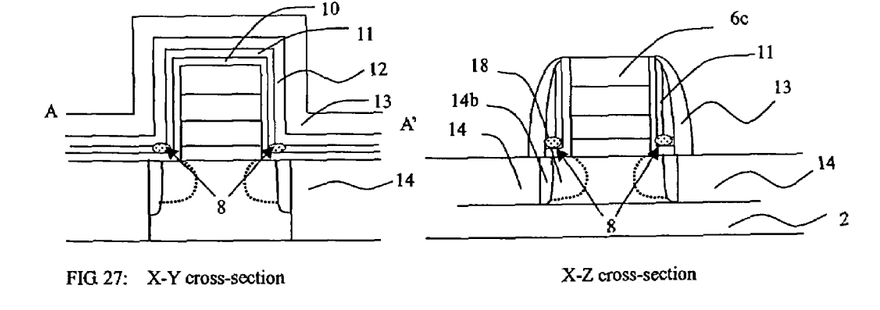
FIG. 27 is a cross sectional view of a semiconductor wafer illustrating the twenty-fourth embodiment according to the present invention.

Please refer to FIGS. 12-13, the examples are similar to the embodiment except an additional dielectric layer is formed between the dielectric 10 and the spacer 12. There are double isolation layers formed on the gate structure 6 prior to the formation of the spacer 12. The barrier layer 10 is formed of oxide, the layer 11 is formed of nitride and the spacer 12 is formed of oxide, therefore, ONO structure is formed.

Similarly, the preferred embodiments from FIGS. 14-19 are the alternative solutions for the corresponding examples of above embodiments. The spacers 12 are formed of oxide and the charge is trapped by the nitride-trapping layer. The corresponding structures, features are very similar to those corresponding examples. Therefore, the description is omitted.

Next, the embodiments shown in FIGS. 20-27 are the alternative arrangements that are associated with figures mentioned above, correspondingly. The main different is that the triple-spacers structure consisting of layers 11, 12 and 13 is introduced into the embodiments and adjacent to the multi-portion structure. The ONO structure is consisted of the oxide layer 10, nitride layer 11 and the oxide spacer 12. The spacer 13 is attached on the spacer 12, the spacer 13 can be formed of oxide, nitride or the like. The configuration, therefore, constructs the triple spacers structure on the multi-portion structure.

In the illustrations of the present invention, form the planar parallel to the surface of the paper, two spacers are located adjacent to the gate, hence, two-bits may be stored in the nitride spacers. Therefore, the present invention provides a multi-bit device for storing multi-bits digital signal. The trapping layer is formed of ONO or ON configuration to trap the carrier, thereby defining the digital states.

The electric field near the S/D junction becomes significant due to the abrupt junction formation of NOI process. The NOI-induced hot carrier effect takes place right under the SiN spacer. The drain node can be defined as first bit and source is defined as second bit, vice verse. The programming is achieved by tunneling effect. The read operation is obtained by applying reverse bias to the source and grounding the drain. During the operation of the NOI n-MOSFETs, the channel current is generated at the drain and it is not significant at the high electronic field. In lieu of altering the current direction between the S/D by the mechanism of reverse read mechanism, it is possible to sense the status of the programming region. In one embodiment, during the reading mode, the S/D bias is 1V/0V, the threshold difference between two bits is higher than 1.2 V. Based on the NOI structure formed between the gate and S/D junction, the induced fringing field is extremely low compared to the conventional SONOS. Therefore, the NOI n-MOSFETs's low induced fringing field and low drain current will lead to longer life time for product.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A fringing field induced charge trapping memory, comprising:

an isolation or semiconductor substrate having a semiconductor layer formed thereon;

a doped region formed in a portion of said semiconductor layer, wherein a pocket ion implantation region is optionally formed adjacent to said doped region, wherein the conductive type of said pocket ion implantation region is opposite to the one of said doped region;

a gate dielectric layer formed on said semiconductor layer;

a gate structure formed on said gate dielectric layer;

a normal field induced channel formed in said semiconductor layer and under said gate structure and said gate dielectric layer, wherein at least one end of said normal field induced channel is electronically connected to said doped region;

a multi-portion structure consisting of a perpendicular portion formed on the sidewall of said gate structure and a parallel portion formed on said semiconductor layer, wherein said parallel portion acts as tunneling part and said perpendicular portion acts as a charge barrier;

a fringing field induced channel formed between said normal field induced channel and said doped region in said semiconductor layer and under said parallel portion of said multi-portion structure, wherein said fringing field induced channel is electronically connected to at least one end of said normal field induced channel;

a charging layer or spacer for charge trapping or charge-storing formed on said multi-portion structure for storing carriers; and metal-semiconductor compounds or silicide formed on said gate structure and said doped region.

2. The memory of claim 1, wherein at least one non-overlapped implantation distance is formed between said gate structure and said doped region.

3. The memory of claim 1, wherein the configuration of said gate structure and said doped region is substantially orthogonal.

4. The memory of claim 1, wherein said field induced channel, said fringing field induced channel and said doped region are non-planar.

5. The memory of claim 1, wherein said gate structure controls multiple normal field induced channels or multiple fringing field induced channels and at least two fringing field induced channels are different in channel resistance.

6. The memory of claim 1, wherein only one said fringing field induced channel is formed between said normal field induced channel and said doped region.

7. The memory of claim 6, wherein carrier flows from said semiconductor layer or normal field induced channel to said doped region through said fringing field induced channel to inject charges into said charging layer.

8. The memory of claim 6, wherein the hot carrier tunneling occurs in said fringing field induced channel and under said multi-portion structure.

9. The memory of claim 6, wherein carrier flows from said doped region to said semiconductor layer or said normal field induced channel through said fringing field induced channel to sense the presence of charges in said charging layer.

10. The memory of claim 1, wherein said perpendicular portion and said parallel portion are formed in different thickness simultaneously or respectively.

11. The memory of claim 1, further comprising: lightly doped drain region adjacent to said doped region, wherein the junction of said lightly doped drain region being shallower than the one of said doped region and under said gate structure.

12. The memory of claim 1, further comprising: double doped drain region adjacent to said doped region, wherein the junction of said double doped drain region being deeper than the one of said doped region and under said gate structure.

13. The memory of claim 1, wherein said charging layer (or spacer) is formed of nitride or the material having energy gap lower than 6 eV.

14. The memory of claim 1, wherein said charging layer (or spacer) is formed of nano-scale particles having size less than 10 nm and energy gap lower than 6 eV.

15. The memory of claim 1, further comprising a first dielectric layer (or spacer) formed on said charging layer (or spacer) wherein said first dielectric layer (or spacer) includes oxide or the material having energy gap greater than 7 eV.

16. The memory of claim 15, further comprising a second dielectric layer (or spacer) formed on said first dielectric layer (or spacer) wherein said second dielectric layer (or spacer) includes oxide or nitride.

17. The memory of claim 1, wherein the material of said gate dielectric layer includes silicon oxide ($SiO_2$), zirconium oxide ($ZrO_2$) or hafnium oxide ($HfO_2$).

18. The memory of claim 1, wherein said silicide includes $TiSi_2$, $CoSi_2$ or $NiSi$.

19. The memory of claim 1, wherein the material of said gate structure includes polysilicon/silicide/isolation layer stack.

* * * * *